(12) United States Patent
Furuta et al.

(10) Patent No.: US 8,899,650 B2
(45) Date of Patent: Dec. 2, 2014

(54) BOARD CONVEYING HAND AND BOARD CONVEYING DEVICE PROVIDED WITH THE SAME

(75) Inventors: Makoto Furuta, Fukuoka (JP); Toru Nakako, Fukuoka (JP); Tetsuya Yamasaki, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 433 days.

(21) Appl. No.: 13/283,647

(22) Filed: Oct. 28, 2011

(65) Prior Publication Data

US 2012/0107081 A1 May 3, 2012

(30) Foreign Application Priority Data

Nov. 1, 2010 (JP) ................................. 2010-245617

(51) Int. Cl.
*H01L 21/68* (2006.01)
*B65G 49/07* (2006.01)
*G02F 1/13* (2006.01)
*H01L 21/683* (2006.01)
*B65G 47/91* (2006.01)
*B25J 15/06* (2006.01)
*H01L 21/677* (2006.01)
*H01L 21/687* (2006.01)

(52) U.S. Cl.
CPC ......... *H01L 21/6838* (2013.01); *B25J 15/0616* (2013.01); *B65G 47/918* (2013.01); *H01L 21/67748* (2013.01); *H01L 21/67742* (2013.01); *H01L 21/6875* (2013.01)
USPC ......... 294/188; 294/213; 414/737; 414/752.1

(58) Field of Classification Search
CPC ........ B21D 43/05; B21D 43/52; B21D 43/55; B21D 43/105; B25B 11/07; B25J 15/616; B60P 1/52; B62B 2203/29; H05K 13/413; B65G 47/91; B65G 47/901; B65G 47/904; B65G 47/907; B66C 1/02; B66C 1/212; B66C 1/256; B66F 9/181; B66F 9/195; B66F 9/12; B66F 9/18; B66F 9/06; B66F 9/122; H01L 21/6838; H01L 21/67167; H01L 21/67733; H01L 21/67736; H01L 21/67742; H01L 21/67748; H01L 21/67769; H01L 21/68707
USPC ......... 414/627, 752.1, 785, 806, 815, 222.01, 414/437, 744; 901/40; 198/468.2, 468.4
See application file for complete search history.

(56) References Cited

FOREIGN PATENT DOCUMENTS

JP 08-107136 * 4/1996 .............. H01L 21/68
JP 2007-083322 4/2007

OTHER PUBLICATIONS

Japanese Office Action for corresponding JP Application No. 2010-245617, Jul. 24, 2012.

* cited by examiner

*Primary Examiner* — Saul Rodriguez
*Assistant Examiner* — Ronald Jarrett
(74) *Attorney, Agent, or Firm* — Mori & Ward, LLP

(57) ABSTRACT

An adsorbent in a board conveying hand includes: a pad for adsorbing a board in contact with the board; and an elastic member interposed between the fork and the pad and provided with an adsorption passage for allowing an adsorbing fluid to pass between the fork and the pad, wherein a part of the elastic member is deformed, thus arbitrarily varying a projection amount of the pad from the fork.

9 Claims, 9 Drawing Sheets

BOARD CONVEYING HAND AND BOARD CONVEYING DEVICE PROVIDED WITH THE SAME

CROSS-REFERENCE TO RELATED APPLICATIONS

The present application claims priority under 35 U.S.C. §119 to Japanese Patent Application No. 2010-245617 filed Nov. 1, 2010. The contents of this application are incorporated herein by reference in their entirety.

BACKGROUND OF THE INVENTION

1. Field of the Invention

The present invention relates to a board conveying hand for adsorptively holding a board and a board conveying device provided with the same.

2. Discussion of the Background

A board conveying device has been utilized in conveying a thin board such as glass or a semiconductor wafer for use in fabricating a liquid crystal display, a plasma display, a semiconductor, and the like. The board conveying device is frequently used in taking out a board housed inside of a cassette to deliver it to a board processing device or receiving a board from a board processing device to house it inside of a cassette. Most of the board conveying devices to be used in such a manner is provided with a board conveying hand for mounting a board thereon while conveying it (see, for example, Japanese Patent Application Laid-open No. 2007-83322).

The board conveying hand includes a plurality of rod-like forks with respect to a support member, the forks mounting a board thereon. Each of the forks has an adsorbent for preventing the board from being shifted when it is conveyed. The adsorbent adsorptively holds the board. In the board conveying device, for example, the forks are inserted inside of the cassette, and then, the board is adsorptively held by the adsorbents formed on the forks, to be thus conveyed to a desired destination in a board processing device or the like.

On the other hand, a pitch between the boards inside of the cassette (i.e., a clearance between the boards) has been reduced in order to increase board mountability inside of the cassette for the purpose of enhancement of productivity. Similarly, the board has become larger for the purpose of enhancement of productivity, with an attendant problem that the board is liable to be flexibly deformed. Worse still, as the board has become larger, the fork need be formed into a long rod, so that when the board conveying hand is actuated by the board conveying device, the tip of the fork, in particular, is liable to be largely vibrated. As a consequence, since the fork of the board conveying hand hardly intrudes into the cassette, various ideas have been designed such that the thickness of the fork is reduced while the rigidity of the fork is enhanced so that the vibration is suppressed.

SUMMARY OF THE INVENTION

A board conveying hand in one embodiment according to the present invention includes a fork and an adsorbent provided in the fork, for adsorbing a board, in which the board is adsorptively held by the adsorbent and conveyed, the adsorbent including: a pad for adsorbing the board in contact with the board; and an elastic member interposed between the fork and the pad and provided with an adsorption passage for allowing an adsorbing fluid to pass between the fork and the pad, wherein a part of the elastic member is deformed by the adsorbing fluid, thus arbitrarily varying a projection amount of the pad from the fork.

A board conveying method for conveying a board out of a cassette housing therein boards in a multiple stages by the board conveying hand in one embodiment according to the present invention includes the steps of: reducing the projection amount of the pad from the fork; inserting the fork between the board to be conveyed inside of the cassette and the board adjacent to the board to be conveyed while reducing the projection amount; stopping the reduction of the projection amount after the completion of the insertion; allowing the fork to approach the board to be conveyed, thus bringing the pad into contact with the board to be conveyed; adsorbing the board to be conveyed to the pad; and drawing the fork from the cassette.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

A detailed description will be given below of embodiments embodying the present invention with reference to the attached drawings for the sake of understanding the present invention. Here, component parts irrelevant to the description may be omitted in each of the drawings.

Figure 1:
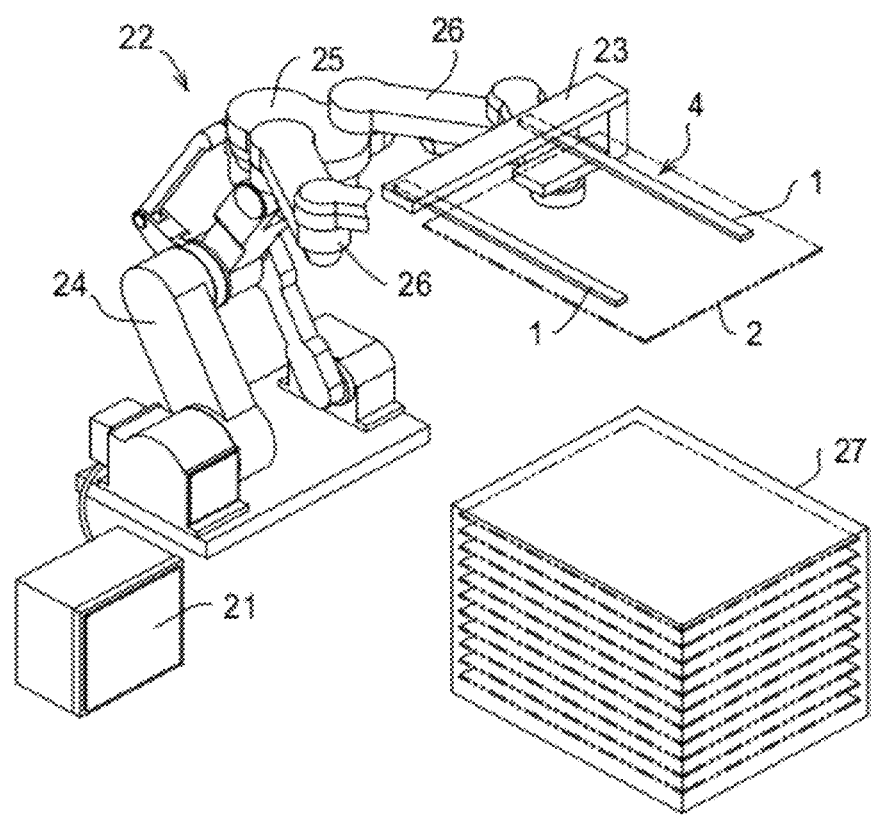
FIG. 1 is a perspective view showing a board conveying device provided with a board conveying hand in one embodiment according to the present invention.

FIG. 1 is a perspective view showing a board conveying device 22 provided with a board conveying hand 4 in one embodiment according to the present invention. As shown in FIG. 1, the board conveying device 22 in the present embodiment is adapted to convey a board 2 housed inside of a cassette 27. The cassette 27 is installed within an operational range of the board conveying device 22, that is, within a range in which the board conveying hand 4 can reach. In the present embodiment, the cassette 27 houses the boards 2 in multiple stages in a vertical direction while keeping the surfaces of the boards 2 in a horizontal direction. Alternatively, the cassette 27 may house the boards 2 while keeping the surfaces of the boards 2 substantially in a vertical direction.

The board conveying hand 4 is actuated by the board conveying device 22, to thus adsorb the board 2 housed in the cassette 27 and then convey it. The board 2 is supported by a fork 1 of the board conveying hand 4 while being conveyed. The fork 1 is made of, for example, carbon fiber reinforced plastics. The fork 1 is supported at the base thereof by a support member 23. Here, a plurality of forks 1 are generally supported by the support member 23. The support member 23 is supported at the tip of an extendable mechanism 26.

In the present embodiment, the extendable mechanism 26 is a horizontally articulated arm configured by a plurality of arms turnably connected to each other. In this manner, the board conveying hand 4 moves in a horizontal direction by the extendable mechanism 26. The extendable mechanism 26 is supported at its base by a pivotal mechanism 25.

The pivotal mechanism 25 can pivot on a rotational axis in a vertical direction. In other words, the pivotal mechanism 25 is designed to pivot the extendable mechanism 26 and the board conveying hand 4 on a horizontal plane. Incidentally, the pivotal mechanism 25 is provided with another extendable mechanism 26. The two extendable mechanisms 26 are provided in total. Another board conveying hand 4 is connected to the tip of the other extendable mechanism 26. For the sake of easy understanding, the other extendable mechanism 26 is not shown on the way. The number of boards 2 to be conveyed in unit period of time can be increased by providing the two extendable mechanisms 26, that is, the two board conveying hands 4. The pivotal mechanism 25 is supported by an elevatable mechanism 24. The elevatable mechanism 24 is adapted to elevate the pivotal mechanism 25, the extendable mechanisms 26, and the board conveying hands 4 in a vertical direction. In the present embodiment, the pivotal mechanism 25 is constituted of a link mechanism.

The elevatable mechanism 24 is mounted on a base table. The base table is installed on a floor in a factory or the like. Here, the base table may be supported in an operating unit of a traveling mechanism, not shown. When the base table is supported in the traveling mechanism, the base table can move on the floor.

Each of the above-described mechanisms is driven by a servo motor, not shown. It is a controller 21 that controls the operation of the servo motor. The controller 21 previously stores therein programs for instructing the operational speed or rotational position of the servo motor so as to move the board conveying hand 4 at a destination when the board conveying device 22 performs a target operation.

With the above-described configuration, the board conveying device 22 places the board 2 on the board conveying hand 4 in accordance with the instruction from the controller 21, and then, conveys it from a certain position to the destination.

Figure 2A:
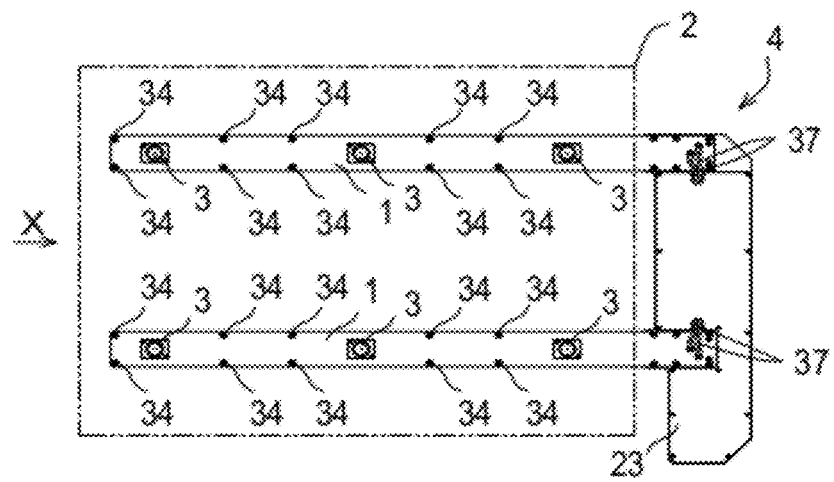
FIGS. 2A to 2C are views showing the board conveying hand in one embodiment.
Figure 2B:
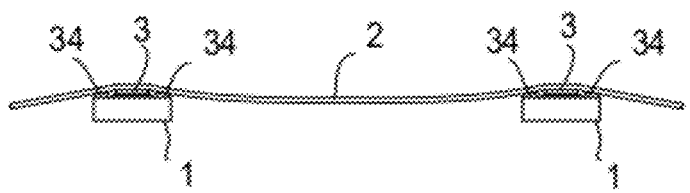
Figure 2C:
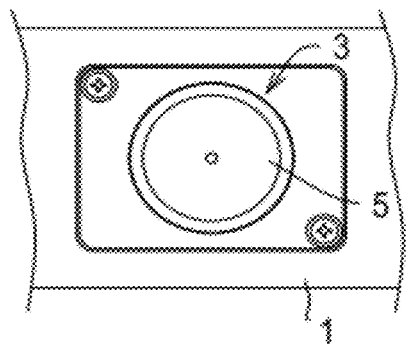

FIGS. 2A to 2C are views showing the board conveying hand in one embodiment according to the present invention. FIG. 2A is a plan view showing the board conveying hand 4, as viewed from the top; FIG. 2B is a side view, as viewed in a direction indicated by an arrow X in FIG. 2A; and FIG. 2C is a plan view showing only an adsorbent 3, described later.

As shown in FIG. 2A, the two forks 1 are supported at the bases thereof in the support member 23 in the present embodiment. A tube 37 for allowing an adsorbing fluid to pass therethrough is pipelined in the support member 23. The adsorbing fluid is vacuum air. The tube 37 reaches the support member 23 wired through the elevatable mechanism 24, the pivotal mechanism 25, and the extendable mechanism 26 from the base table side in FIG. 1. The tube 37 is connected at its base to a supply source for the adsorbing fluid such as a pump, although now shown. The fork 1 is formed in such a manner as to provide a cavity inside thereof from the base to the tip. In the present embodiment, the tube 37 is pipelined in the cavity.

The plurality of adsorbents 3 are mounted on the flat surface of the fork 1. Although the detailed configuration of the adsorbent 3 will be described later, the tube 37 is connected to the adsorbent 3, and then, the board 2 can be arbitrarily adsorbed. As shown in FIG. 2C, the adsorbent 3 includes a pad 5 which is brought into contact with the board 2 so as to adsorb the board 2. The pad 5 is made of, for example, a resin. A plurality of board rests 34 are mounted on the flat surface of the fork 1 together with the adsorbents 3.

As shown in FIG. 2B, the board rest 34 is provided for preventing any direct contact between the board 2 and the fork 1 in the case where the board 2 may be flexed due to gravity because the board 2 is thin when the adsorbents 3 adsorptively support the board 2.

The adsorbent 3 will be described in more details below. The adsorbent 3 for the board conveying hand 4 in one embodiment according to the present invention is designed such that the pad 5 can variously project from the fork 1. Consequently, for example, even if the boards 2 are housed inside of the cassette 27 or the like with a narrow board pitch, the adsorbent 3 can approach the board 2 to thus adsorptively convey the board 2 without any trouble by allowing the fork 1 to intrude into the cassette 27 in the state in which the pad 5 slightly projects from the fork 1.

Figure 3A:
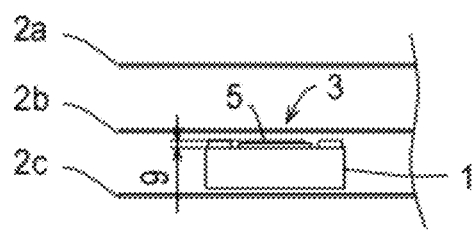
FIGS. 3A to 3C are views showing the board conveying hand which conveys a board from a cassette.
Figure 3B:
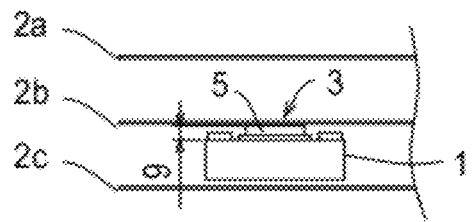
Figure 3C:
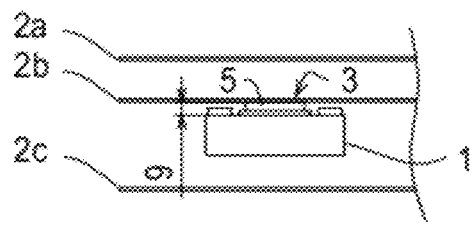

FIGS. 3A to 3C are views showing the board conveying hand 4 which conveys the board 2 from the cassette 27 in one embodiment according to the present invention. FIGS. 3A to 3C are side views, as viewed from the tip of either one of the pluralities of forks 1. First, as shown in FIG. 3A, the board conveying hand 4 is inserted between a board 2b to be adsorptively conveyed and a board 2c right under the board 2b in the state in which a projection amount 9 of the pad 5 is sufficiently small. At this time, since the projection amount 9 of the pad 5 is sufficiently small, the pad 5 of the adsorbent 3 cannot be brought into contact with the lower surface of the board 2b to be conveyed. The lower surface of the fork 1 cannot be brought into contact with the board 2c right under the board 2b, either.

Next, as shown in FIG. 3B, the projection amount 9 at the adsorbent 3 returns to a normal value between the board 2b to be conveyed and the board 2c right under the board 2b. At this time, the pad 5 of the adsorbent 3 is brought into contact with the lower surface of the board 2b to be conveyed or is located at as small a height as it is not brought into contact with the lower surface of the board 2b to be conveyed.

Subsequently, as shown in FIG. 3C, the board conveying device 22 slightly elevates the board conveying hand 4. At this time, the pad 5 of the adsorbent 3 supports the board 2 in contact with the lower surface of the board 2b to be conveyed. Here, if the board 2b to be conveyed is flexed, the pad 5 is inclined in conformity with the flexure of the board 2b to be conveyed.

Then, the pad 5 of the adsorbent 3 adsorbs the board 2. Thereafter, the board conveying device 22 draws the board conveying hand 4 from the cassette 27. In other words, the board conveying device 22 draws the board 2b to be conveyed from between a board 2a right above the board 2b and the board 2c right under the board 2b. After that, the board conveying device 22 conveys the board 2b to be conveyed to the destination.

That is to say, with the board conveying hand 4 in one embodiment according to the present invention, the thickness of the board conveying hand 4 obtained by summing the fork 1 and the adsorbent 3 projecting from the fork 1 can be temporarily reduced. As a consequence, the adsorbent 3 in the board conveying hand 4 can be allowed to approach even the board 2 placed with a narrow board pitch without any trouble.

Next, explanation will be made on specific embodiments in which the projection amount 9 of the pad 5 from the fork 1 is varied in the adsorbent 3. The common matters to some embodiments, described below, are, as follows: like a first embodiment shown in FIGS. 4A to 4C, the adsorbent 3 is provided with the pad 5 which adsorbs the board 2 in contact with the board 2 and an elastic member 8 including an adsorption passage 7 which is formed between the fork 1 and the pad 5 so as to allow an adsorbing fluid to communicate between the fork 1 and the pad 5, and further, the adsorbent 3 is configured such that the projection amount 9 of the pad 5 from the fork 1 is varied by partly deforming the elastic member 8. More specifically, the elastic member 8 includes an adsorption passage clearance 20 and a projection amount adjustment clearance 10 independent of the adsorption passage clearance 20; the fork 1 is provided with a first passage 11 and a second passage 12, through which an adsorbing fluid 6 is supplied, the first passage 11 and the second passage 12 being configured such that they can independently suck the adsorbing fluid 6, and further, either one of the first passage 11 and the second passage 12 communicating with the projection amount adjustment clearance 10 whereas the other passage communicating with the adsorption passage clearance 20; and the adsorbing fluid 6 is supplied to the first passage 11 or the second passage 12 communicating with the projection amount adjustment clearance 10 so that the projection amount adjustment clearance 10 and the adsorption passage clearance 20 are reduced so as to vary the projection amount 9. Namely, in some of the embodiments described below, the adsorbing fluid 6 for use in adsorbing the board 2 is illustrated by way of the use for the variation of the projection amount 9 of the pad 5. More particularly, the elastic member 8 is provided with a pad supporter 13 which supports the pad 5 and includes the adsorption passage 7 formed therein, and a first annular leg 16 which is formed in the pad supporter 13 and defines the adsorption passage clearance 20 communicating with the adsorption passage 7 between the pad supporter 13 and the fork 1. When the first annular leg 16 is reduced by its deformation, the projection amount 9 is varied. More specifically, the elastic member 8 is further provided with a second annular leg 17 which is formed independently of the first annular leg 16 in the pad supporter 13 and defines the projection amount adjustment clearance 10 between the pad supporter 13 and the fork 1. Air staying inside of the projection amount adjustment clearance 10 is sucked, so that the first annular leg 16 and the second annular leg 17 are deformed so as to reduce the adsorption passage clearance 20, thereby varying the projection amount 9. As described later, the pad supporter 13 may be divided into a first pad supporter 14 having the first annular leg 16 and a second pad supporter 15 having the second annular leg 17.

Figure 4A:
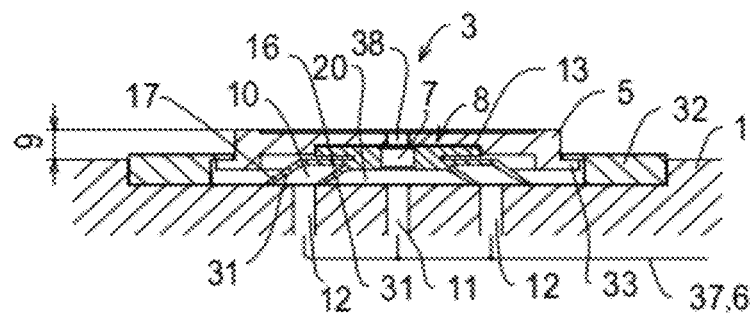
FIGS. 4A to 4C are views showing an adsorbent of the board conveying hand in a first embodiment.
Figure 4B:
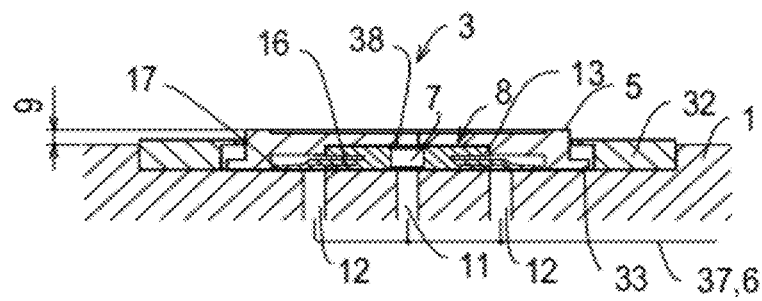
Figure 4C:
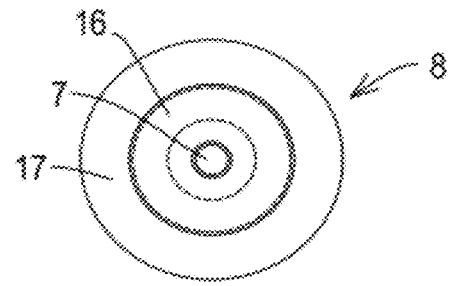

First of all, explanation will be made on the adsorbent 3 in the first embodiment. FIGS. 4A to 4C are views showing the adsorbent 3 of the board conveying hand 4 in the first embodiment, in which FIG. 4A is a side cross-sectional view showing the fork 1 and the adsorbent 3 when the pad 5 is in the normal condition and FIG. 4B shows the condition in which the projection amount 9 of the pad 5 is reduced in comparison with that in FIG. 4A.

As shown in FIGS. 4A and 4B, a step face lower than the surface of the fork 1 is formed thereat, and the step face has the elastic member 8 placed thereon. The pad supporter 13 is formed in the elastic member 8, to be fixed or fitted to the pad 5. The first annular leg 16 is formed on a side opposite to the pad 5 in the pad supporter 13. The first annular leg 16 is suspended from the pad supporter 13 in an annular shape in such a manner as to define an inclined face 31. The first annular leg 16 is made of, for example, a thin elastic material. Incidentally, although it is desirable that the pad supporter 13 should be integrally made of the same material as that of the first annular leg 16, it is not limited to this. The first annular leg 16 is brought at the end thereof into contact with the step face of the fork 1.

In the pad supporter 13, the second annular leg 17 is formed outside of the first annular leg 16 at a position coaxial with the first annular leg 16 in such a manner as to surround the first annular leg 16. The second annular leg 17 is suspended from the pad supporter 13 in the annular shape in such a manner as to define an inclined face 31, like the first annular leg 16. The second annular leg 17 also is made of a thin elastic material, like the first annular leg 16. The second annular leg 17 is brought at the end thereof into contact with the face of the fork 1, like the first annular leg 16.

As described above, the first annular leg 16 and the second annular leg 17 are formed in such a manner as to define the inclined faces 31 with respect to the fork 1. As described later, the inclined faces 31 act in such a manner that the first annular leg 16 and the second annular leg 17 are likely to be deformed. However, unlike the inclined surface 31, the first annular leg 16 and the second annular leg 17 may be formed into any shapes such as a bellows shape as long as they can define the projection amount adjustment clearance 10 and the adsorption passage clearance 20 and be likely to be deformed. As described above, the pad 5 is elastically supported with respect to the fork 1 by the first annular leg 16 and the second annular leg 17 in the elastic member 8.

Moreover, a lock 33 is disposed entirely or partly on the outermost periphery of the pad 5. Additionally, a pad stopper 32 is provided in such a manner as to stop the lock 33 against the fork 1. The pad stopper 32 is formed into a ring shape, and is secured to the fork 1 in such a manner as to be contained in the step face of the fork 1. The pad stopper 32 stops the lock 33 of the pad 5 on the inner circumference of the ring thereof. The pad stopper 32 stops the lock 33 of the pad 5 by slight amount in the state in which the pad 5 is elastically supported by the elastic member 8, and thus, brings the end of the first annular leg 16 or the second annular leg 17 into secure contact with the fork 1. Furthermore, the pad stopper 32 stops the pad 5 to be in the state in which the lock 33 and the fork 1 have a predetermined clearance therebetween. The clearance allows the inclination of the pad 5 with respect to the fork 1 and the descent of the pad 5 closely to the fork 1, as shown in FIG. 4B, within a range in which the lock 33 is brought into contact with the fork 1.

In the meantime, the first passage 11 and the second passage 12 are formed in the fork 1. The adsorbing fluid 6 is supplied to the first passage 11 and the second passage 12 through the tube 37 described above. A solenoid valve, for example, is disposed on the way of the tube 37, although not shown, so that the adsorbing fluid 6 can be independently supplied to the first passage 11 and the second passage 12, as required. The first passage 11 communicates with the adsorption passage clearance 20 defined by the second annular leg 17, the fork 1, and the pad supporter 13. In contrast, the second passage 12 communicates with the projection amount adjustment clearance 10 defined by the first annular leg 16, the second annular leg 17, the fork 1, and the pad supporter 13. Moreover, the adsorption passage 7 is formed in the pad supporter 13. The adsorption passage 7 communicates with the adsorption passage clearance 20. Furthermore, the adsorption passage 7 communicates with the pad 5. In the present embodiment, an adsorption hole 38 communicating with the adsorption passage 7 is formed at the pad 5. When the adsorbing fluid 6 is supplied to the first passage 11 in the state in which the board 2 is brought into contact with the pad 5, the board 2 is adsorbed by the pad 5. Here, if the pad 5 is made of, for example, a porous material such as ceramics, a hole communicating with the adsorption passage 7 need not always be formed in the pad 5.

With the above-described configuration, operations and functions will be explained below.

(1) First of all, in the state shown in FIG. 4A, that is, in the state in which the board 2 is not adsorbed by the adsorbent 3, the adsorbing fluid 6 is supplied to the second passage 12. Then, the air staying inside of the projection amount adjustment clearance 10 is sucked to the second passage 12. Thereafter, the first annular leg 16 and the second annular leg 17 are elastically deformed, so that their respective inclined faces 31 are brought into contact with the fork 1 in the state shown in FIG. 4B. In other words, the projection amount adjustment clearance 10 and the adsorption passage clearance 20 are reduced, and thus, the elastic member 8 approaches the fork 1 to be attached to the fork 1. After that, the pad 5 securely supported by the pad supporter 13 also approaches the fork 1. At this time, the projection amount 9 of the pad 5 from the fork 1 is reduced in comparison with that before the adsorbing fluid 6 is supplied to the second passage 12.

(2) In this state, as described with reference to FIGS. 3A to 3C, the board conveying hand 4 causes the adsorbent 3 to approach the board 2 placed with the narrow board pitch. That is to say, the board conveying hand 4 intrudes into the clearance immediately under the board 2 placed with the narrow board pitch, like in the cassette 27 shown in FIG. 1. Here, the projection amount 9 of the pad 5 from the fork 1 is reduced, and therefore, the intrusion is carried out without any trouble.

(3) Thereafter, in the state in which the adsorbent 3 and the board 2 approach each other, the adsorbing fluid 6 is stopped to be supplied to the second passage 12. Then, the elastic restoration of the first annular leg 16 and the second annular leg 17 returns the adsorbent 3 and the board 2 to the original state shown in FIG. 4A. In this state, since the pad 5 is elastically supported by the elastic member 8, the pad 5 can be inclined and approach with respect to the fork 1 within the range in contact of the lock 33 with the pad stopper 32.

(4) In this state, as described with reference to FIGS. 3A to 3C, when the board conveying hand 4 is actuated to place the board 2 on the pad 5, the pad 5 is inclined along the face of the board 2 while being brought into contact with the board 2 even if the board 2 is flexed, as shown in FIG. 2B.

(5) In this state, when the adsorbing fluid 6 is supplied to the first passage 11, the pad 5 certainly adsorbs the board 2. At this time, the air staying inside of the adsorption passage clearance 20 is sucked, and therefore, the pad 5 and the elastic member 8 return to the state shown in FIG. 4B. Also at this time, the board 2 is adsorbed to the pad 5 substantially in parallel to the face of the fork 1 along the pad 5 and the elastic member 8.

(6) Thereafter, the board conveying hand 4 adsorbs the board 2 while conveying the board 2 to a predetermined position.

Incidentally, in the case where, for example, it is unnecessary for the pad 5 to adsorb the board 2 along the face of the board 2 since the board 2 is not flexed, as shown in FIG. 2B, the adsorbing fluid 6 is started to be supplied to the first passage 11 before the adsorbing fluid 6 is stopped to be supplied to the second passage 12 in (3) above or while the adsorbing fluid 6 is supplied to the second passage 12, so that the board conveying hand 4 may be actuated to adsorb the board 2 to the pad 5.

As described above, in the first embodiment shown in FIGS. 4A to 4C, the pad supporter 13 in the elastic member 8 includes the first annular leg 16 and the second annular leg 17. FIG. 4C is a bottom view showing only the elastic member 8.

As clearly shown in FIG. 4C, the first annular leg 16 and the second annular leg 17 are formed coaxially with each other. In other words, the first annular leg 16 and the second annular leg 17 are formed in the common pad supporter 13. In the first embodiment, the projection amount adjustment clearance 10 utilizes the clearance defined by the first annular leg 16 and the second annular leg 17. Consequently, in the first embodiment, the small-sized adsorbent 3 can be achieved, unlike a second embodiment, described below, or the like. Namely, the first embodiment is suitable for the fork 1 in the narrow space.

Figure 5A:
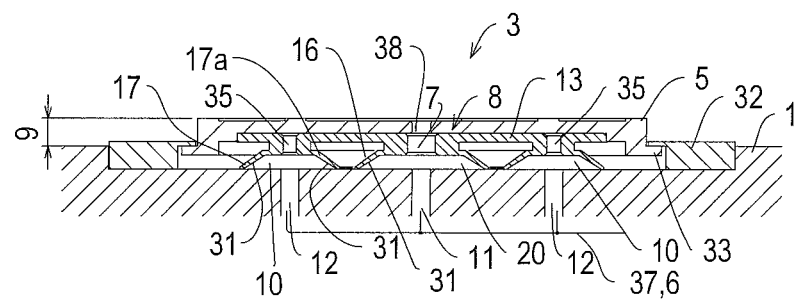
FIGS. 5A to 5C are views showing an adsorbent of the board conveying hand in a second embodiment.
Figure 5B:
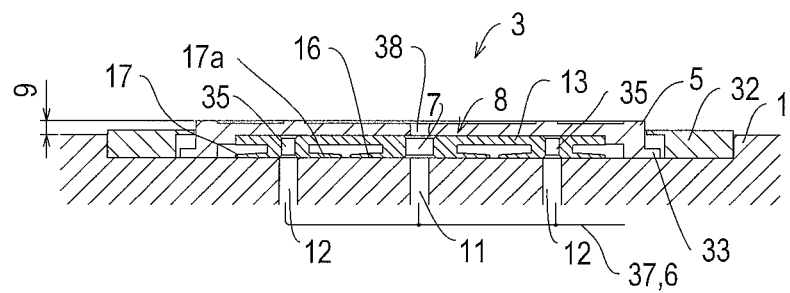
Figure 5C:
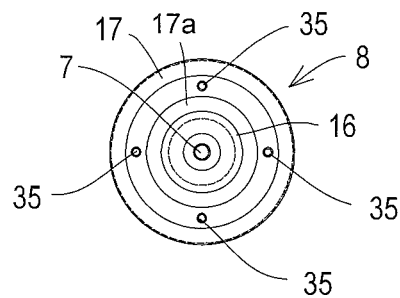

Next, explanation will be made on the adsorbent 3 in a second embodiment. FIGS. 5A to 5C are views showing the adsorbent 3 of the board conveying hand 4 in the second embodiment, in which FIG. 5A is a side cross-sectional view showing the fork 1 and the adsorbent 3 when the pad 5 is in the normal condition and FIG. 5B shows the condition in which the projection amount 9 of the pad 5 is reduced in comparison with that in FIG. 5A, that is, the pad 5 is sucked toward the fork 1. FIG. 5C is a view showing only a bottom face of the elastic member 8. Here, the elastic member 8 in FIG. 5C is shown in a smaller dimension than those shown in FIGS. 5A and 5B. The same component parts in FIGS. 5A to 5C as those in the first embodiment are designated by the same reference numerals, and therefore, their detailed explanation will be omitted below. A difference from the first embodiment will be mainly explained below.

Although the second embodiment is identical to the first embodiment in that the first annular leg 16 and the second annular leg 17 are formed with respect to the common pad supporter 13, the shape of the second annular leg 17 is different. As for the second annular leg 17, the projection amount adjustment clearance 10 is defined by utilizing the first annular leg 16 in the first embodiment: in contrast, another second annular leg 17a is interposed between the first annular leg 16 and the second annular leg 17 in the second embodiment. In other words, the second annular leg 17 is doubly provided. The second annular leg 17 and the second annular leg 17a doubly defining the projection amount adjustment clearance 10 are disposed coaxially with the first annular leg 16. Specifically, in comparison with the first embodiment, the second embodiment is identical to the first embodiment in that the projection amount adjustment clearance 10 and the adsorption passage clearance 20 are defined in a part of the elastic member 8 but it is different in that the adsorption passage clearance 20 is defined without utilizing the first annular leg 16. A space capacity of the projection amount adjustment clearance 10 in the second embodiment becomes greater than that in the first embodiment, thereby securely reducing the projection amount 9 of the pad 5 when the projection amount adjustment clearance 10 is sucked. Moreover, the restoration of the elastic member 8 can be securely expected more than that in the second embodiment.

Figure 6A:
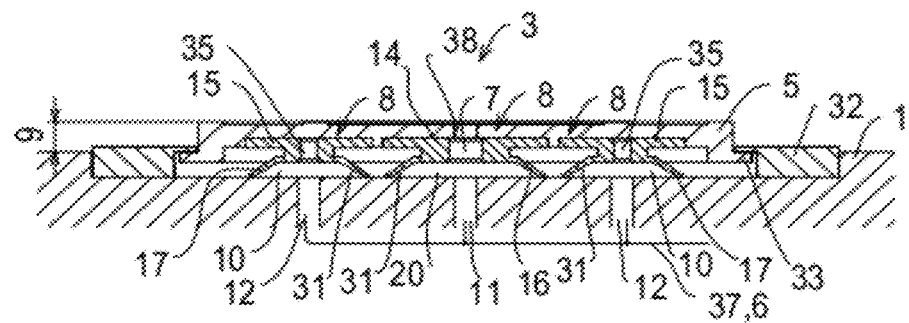
FIGS. 6A to 6C are views showing an adsorbent of the board conveying hand in a third embodiment.
Figure 6B:
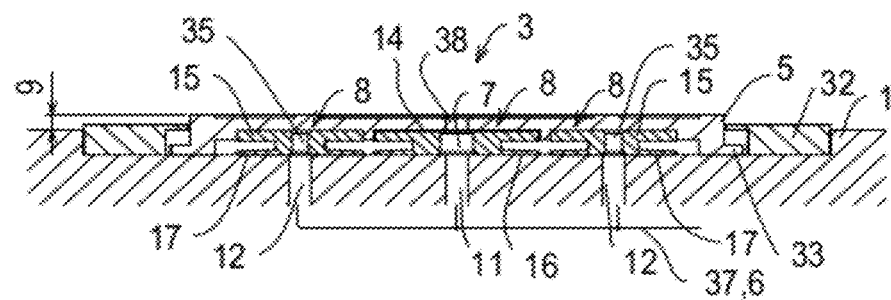
Figure 6C:
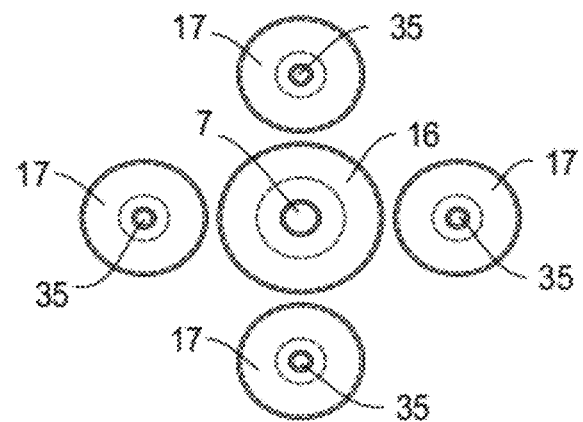

Subsequently, explanation will be made on the adsorbent 3 in a third embodiment. FIGS. 6A to 6C are views showing the adsorbent 3 of the board conveying hand 4 in the third embodiment, in which FIG. 6A is a side cross-sectional view showing the fork 1 and the adsorbent 3 when the pad 5 is in the normal condition and FIG. 6B shows the condition in which the projection amount 9 of the pad 5 is reduced in comparison with that in FIG. 6A, that is, the pad 5 is sucked toward the fork 1. FIG. 6C is a view showing only a bottom face of the elastic member 8. The same component parts in FIGS. 6A to 6C as those in the first or second embodiment are designated by the same reference numerals, and therefore, their detailed explanation will be omitted below. A difference from the first or second embodiment will be mainly explained below.

The third embodiment is mainly different from the first or second embodiment in that the pad supporter 13 is divided into a first pad supporter 14 and a second pad supporter 15. In other words, although the first annular leg 16 and the second annular leg 17 are formed in the common pad supporter 13 in the first or second embodiment, the first annular leg 16 is formed in the first pad supporter 14 whereas the second annular leg 17 is formed in the second pad supporter 15 independent of the first pad supporter 14 in the third embodiment. Moreover, as clearly shown in FIG. 6C, the plurality of second pad supporters 15 are arranged around the first pad supporter 14 provided with the first annular leg 16 in the third embodiment. The number of second annular legs 17 in the second pad supporter 15 and the number of first annular legs 16 in the first pad supporter 14 are not essentially limited as long as the pad 5 can uniformly approach the fork 1 without any inclination when the adsorbing fluid 6 is supplied to the second passage 12. A plurality of projection amount adjustment clearances 10 are independently provided in the third embodiment. Consequently, even in the case where, for example, any of the second annular legs 17 defining the projection amount adjustment clearances 10 are broken, and therefore, the adsorbing fluid 6 cannot be sucked from the second passage 12, the adsorbing fluid 6 can be sucked to the other projection amount adjustment clearances 10 with high possibility.

Figure 7A:
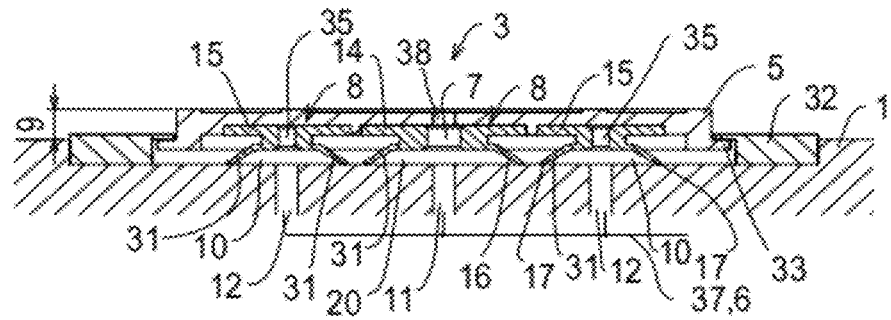
FIGS. 7A to 7D are views showing an adsorbent of the board conveying hand in a fourth embodiment.
Figure 7B:
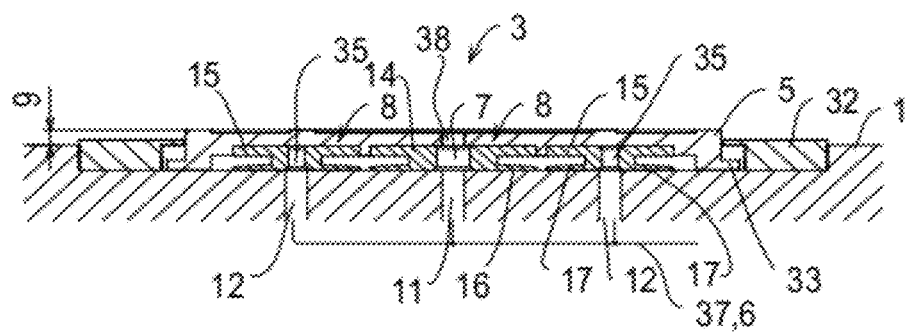
Figure 7C:
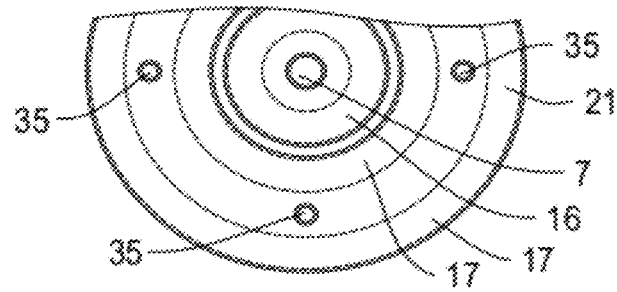
Figure 7D:
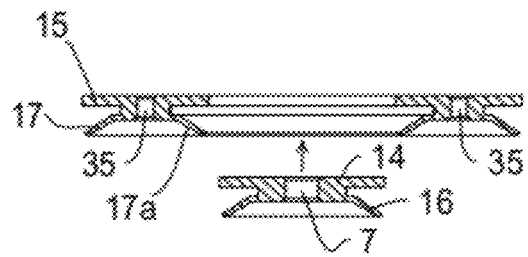

Next, explanation will be made on the adsorbent 3 in a fourth embodiment. FIGS. 7A to 7D are views showing the adsorbent 3 of the board conveying hand 4 in the fourth embodiment, in which FIG. 7A is a side cross-sectional view showing the fork 1 and the adsorbent 3 when the pad 5 is in the normal condition and FIG. 7B shows the condition in which the projection amount 9 of the pad 5 is reduced in comparison with that in FIG. 7A, that is, the pad 5 is sucked toward the fork 1. FIG. 7C is a view showing only a bottom face of the elastic member 8. FIG. 7D is a side cross-sectional view showing the first pad supporter 14, the first annular leg 16, the second pad supporter 15, and the second annular leg 17. The same component parts in FIGS. 7A to 7D as those in the first, second, or third embodiment are designated by the same reference numerals, and therefore, their detailed explanation will be omitted below. A difference from the first, second, or third embodiment will be mainly explained below.

Although the fourth embodiment is identical to the third embodiment in that the pad supporter 13 is divided into the first pad supporter 14 and the second pad supporter 15, it is different in the shape of the second pad supporter 15. Specifically, the plurality of second pad supporters 15 and second annular legs 17 are provided in the third embodiment: in contrast, the second pad supporter 15 and the second annular leg 17 are formed into a doughnut shape coaxially around the first pad supporter 14 and the first annular leg 16 in the fourth embodiment. The fourth embodiment is equivalent to the second embodiment shown in FIGS. 5A to 5C in which the pad supporter 13 is divided into the first pad supporter 14 and the second pad supporter 15. The number of component parts such as the second pad supporters 15 and the second annular legs 17 can be more reduced in the fourth embodiment than in the third embodiment. Moreover, in the case where any of the second pad supporter 15, the second annular leg 17, the first pad supporter 14, and the first annular leg 16 are damaged, only the damaged component part can be replaced with a new one.

Figure 8:
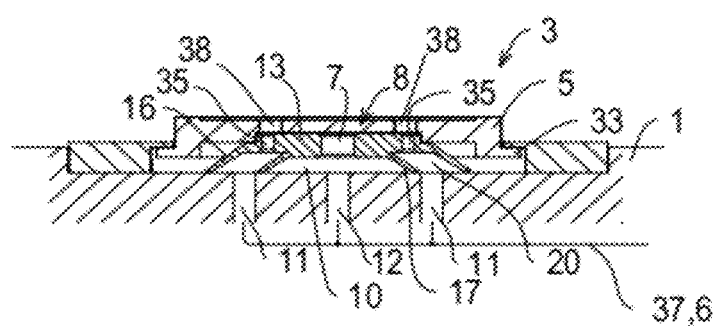
FIG. 8 is a view showing an adsorbent of the board conveying hand in a first modification.

Subsequently, explanation will be made on a first modification which is applicable to the above-described first to fourth embodiments. Specifically, a description will be given of the first modification which is applicable to the first embodiment described above with reference to FIGS. 4A to 4C. FIG. 8 is a side cross-sectional view showing the absorbent 3 in the first modification. In brief, in the first modification, the projection amount adjustment clearances 10 and the adsorption passage clearance 20 are reversely used which have been described in the first to fourth embodiments. In the first modification, a preliminary adsorption passage 35 communicating with a clearance corresponding to the projection amount adjustment clearances 10 shown in FIGS. 4 to 7 is previously formed in the elastic member 8. Moreover, the adsorption hole 38 in the pad 5 is varied to a position corresponding to the preliminary adsorption passage 35. The previous formation of the preliminary adsorption passage 35 in the elastic member 8 during fabrication makes it unnecessary to replace the elastic member 8 irrespective of the present modification or other cases, and therefore, the component parts can be commonly used. The preliminary adsorption passage 35 is shown also in FIGS. 5, 6, and 7.

In this manner, the clearance used as the projection amount adjustment clearance 10 in the first to fourth embodiments can be used as the adsorption passage clearance 20 whereas the clearance used as the adsorption passage clearance 20 can be used as the projection amount adjustment clearance 10. That is to say, this results in that the projection amount adjustment clearance 10 and the adsorption passage clearance 20 are not always used as designed in the first to fourth embodiments.

Figure 9A:
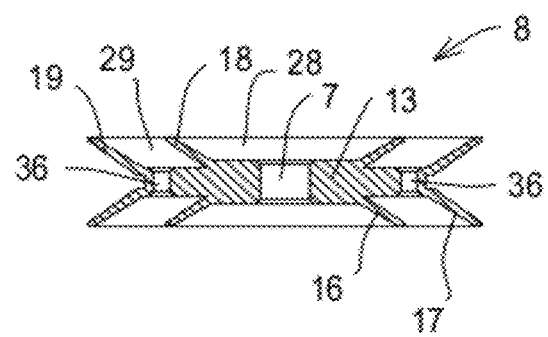
FIGS. 9A and 9B are views showing an adsorbent of the board conveying hand in a second modification.
Figure 9B:
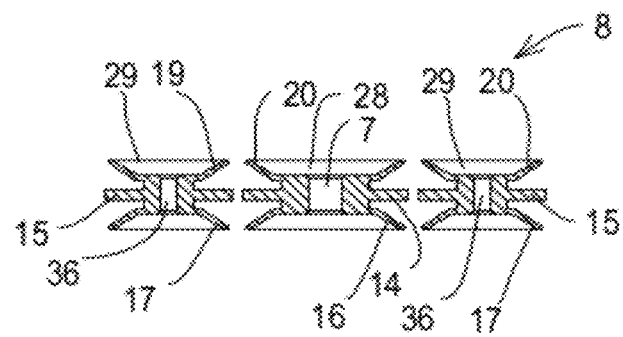

Additionally, explanation will be made on a second modification which is applicable to the above-described first to fourth embodiments. Specifically, a description will be given of the second modification which is applicable to the first embodiment shown in FIGS. 4A to 4C and the third embodiment shown in FIGS. 6A to 6C. FIGS. 9A and 9B are side cross-sectional views of the absorbent 3, which are applicable to the first and third embodiments, respectively. Simply speaking, the second modification discloses the configuration for increasing the projection amount 9 in the elastic member 8 described in the first to fourth embodiments. In the second modification, there are further provided a first auxiliary annular leg 18 defining an absorption passage auxiliary clearance 28 communicating with the adsorption passage clearance 20 and a second auxiliary annular leg 19 defining a projection amount adjustment auxiliary clearance 29 communicating with the projection amount adjustment clearance 10 between the pad supporter 13 (or the first pad supporter 14 or the second pad supporter 15) and the pad 5. In connection with this, there is further provided a communication passage 36 for allowing the projection amount adjustment clearance 10 and the projection amount adjustment auxiliary clearance 29 to communicate with each other.

In this manner, a change in the projection amount 9 of the pad 5 is increased by the functions of the first auxiliary annular leg 18 and the second auxiliary annular leg 19 in the first to fourth embodiments. In other words, when the projection amount adjustment clearance 10 is sucked, the projection amount adjustment auxiliary clearance 29 also is sucked, thereby reducing the space capacity, so as to increase the change in the projection amount 9.

As described above, the board conveying hand in each of the embodiments according to the present invention can convey in and out the board with the narrow board pitch. Specifically, the cassette housing the board therein, for example, can house the boards with the narrow board pitch, thus achieving an apparatus for fabricating a semiconductor or a liquid crystal with a high productivity.

Incidentally, it is noted that the embodiments and the modifications disclosed herein should be illustrative at all points but not restrictive. Moreover, it is conceived that combinations of the embodiments and the modifications disclosed herein should be disclosed in connection. The scope of the present invention is not limited to the embodiments and the modifications described above but is indicated in claims recited independently. Additionally, all variations are encompassed within the meaning and range equivalent to the recitation of claims.

What is claimed as new and is desired to be secured by Letters Patent of the United States is:

1. A board conveying hand comprising a fork and an adsorbent provided in the fork, for adsorbing a board, in which the board is adsorptively held by the adsorbent and conveyed,
   wherein the adsorbent includes:
      a pad for adsorbing the board when the pad is in contact with the board; and
      an elastic member interposed between the fork and the pad and provided with an adsorption passage for allowing an adsorbing fluid to pass between the fork and the pad,
   wherein a projection amount of the pad from the fork is configured to be varied,
   wherein the elastic member includes:
      an adsorption passage clearance communicating with the adsorption passage; and
      a projection amount adjustment clearance independent of the adsorption passage clearance along a direction of a plane parallel to the fork,
   wherein the fork includes:
      a first passage and a second passage, which are passages of the adsorbing fluid;
      the first passage and the second passage being configured to freely suck the adsorbing fluid independently of each other; and
      one of the first passage and the second passage communicating with the adsorption passage clearance, and the other of the first passage and the second passage communicating with the projection amount adjustment clearance,
   wherein the elastic member includes:
      a pad supporter which supports the pad and has the adsorption passage formed therein;
      a first annular leg that is formed at the pad supporter and defines the adsorption passage clearance between the pad supporter and the fork; and
      a second annular leg that is formed at the pad supporter and defines the projection amount adjustment clearance between the pad supporter and the fork, and
   wherein, when the adsorbing fluid inside of the projection amount adjustment clearance is sucked out from the projection amount adjustment clearance, the first annular leg and the second annular leg are deformed to reduce the adsorption passage clearance and the projection amount adjustment clearance, thus varying the projection amount.

2. The board conveying hand according to claim 1, wherein the second annular leg is formed coaxially with the first annular leg and outside of the first annular leg, and
   a clearance surrounded by the first annular leg and the second annular leg serves as the projection amount adjustment clearance.

3. The board conveying hand according to claim 1, wherein the second annular leg is formed coaxially with the first annular leg, and wherein an additional second annular leg is provided outside of the first annular leg.

4. The board conveying hand according to claim 1, wherein the pad supporter is divided into a first pad supporter provided with the first annular leg and a second pad supporter provided with the second annular leg.

5. The board conveying hand according to claim 4, wherein the plurality of second pad supporters are formed around the first pad supporter.

6. The board conveying hand according to claim 1, wherein the pad supporter includes a preliminary adsorption passage communicating with the projection amount adjustment clearance in such a manner that the projection amount adjustment clearance and the adsorption passage clearance can be reversely used.

7. The board conveying hand according to claim 1, wherein the elastic member further includes, between the pad supporter and the pad:
   a first auxiliary annular leg defining an adsorption passage auxiliary clearance communicating with the adsorption passage clearance; and
   a second auxiliary annular leg defining a projection amount adjustment auxiliary clearance communicating with the projection amount adjustment clearance.

8. A board conveying device comprising:
   the board conveying hand according to claim 1;
   a board conveying device for actuating the board conveying hand; and
   a controller previously storing a position at which the board conveying hand is moved.

9. The board conveying hand according to claim 1, wherein the first annular leg and the second annular leg are integrally formed with the pad supporter.

* * * * *